US009046586B2

(12) United States Patent
Yuasa

(10) Patent No.: US 9,046,586 B2
(45) Date of Patent: Jun. 2, 2015

(54) METHOD AND DEVICE FOR DIAGNOSING SECONDARY BATTERY DEGRADATION

(75) Inventor: Shin-ichi Yuasa, Kyoto (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 620 days.

(21) Appl. No.: 13/382,410

(22) PCT Filed: Dec. 10, 2010

(86) PCT No.: PCT/JP2010/007192
§ 371 (c)(1),
(2), (4) Date: Jan. 5, 2012

(87) PCT Pub. No.: WO2011/121692
PCT Pub. Date: Oct. 6, 2011

(65) Prior Publication Data
US 2012/0116701 A1    May 10, 2012

(30) Foreign Application Priority Data
Mar. 29, 2010   (JP) .............................. 2010-074152

(51) Int. Cl.
*G01R 31/36* (2006.01)
*H01M 10/44* (2006.01)
*H01M 10/48* (2006.01)

(52) U.S. Cl.
CPC ........... *G01R 31/3679* (2013.01); *H01M 10/44* (2013.01); *H01M 10/48* (2013.01); *H01M 2220/20* (2013.01); *H01M 2220/30* (2013.01)

(58) Field of Classification Search
CPC ............ H01M 6/5044; H01M 10/045; G01R 31/3679; H02J 7/0004; H02J 7/0086; H02J 7/0018
See application file for complete search history.

(56) References Cited

U.S. PATENT DOCUMENTS

| 8,446,127 B2 * | 5/2013 | Yazami et al. ................ 320/132 |
| 2007/0108946 A1 | 5/2007 | Yamauchi et al. |

(Continued)

FOREIGN PATENT DOCUMENTS

| JP | 2004-152741 | 5/2004 |
| JP | 2007-141464 | 6/2007 |
| JP | 2008-289270 | 11/2008 |

OTHER PUBLICATIONS

International Search Report issued in International Patent Application No. PCT/JP2010/007192 dated Mar. 15, 2011.

*Primary Examiner* — Elias Desta
(74) *Attorney, Agent, or Firm* — McDermott Will & Emery LLP

(57) ABSTRACT

During charging of a secondary battery, a rate of voltage change dV/dt is obtained when a voltage V of the secondary battery reaches a predetermined voltage $V_{pre}$, a charge current I for charging the secondary battery is detected, and a rate of change dQ/dt in a quantity of charged electricity Q of the secondary battery is calculated on the basis of the result of the detection. Here, the predetermined voltage $V_{pre}$ is a voltage higher than a discharge cutoff voltage and lower than a charge cutoff voltage. Thereafter, a ratio X: dQ/dV, of the rate of change dQ/dt in the quantity of charged electricity to the rate of voltage change dV/dt is calculated. The calculated ratio X is compared with a reference value $X_{ref}$, and degradation of the secondary battery is determined on the basis of the result of the comparison.

10 Claims, 5 Drawing Sheets

(56) References Cited

U.S. PATENT DOCUMENTS

2009/0027056 A1* 1/2009 Huang et al. .................. 324/439
2009/0186257 A1 7/2009 Sakai et al.
2009/0212736 A1* 8/2009 Baarman et al. .............. 320/106
2010/0188039 A1 7/2010 Yamauchi et al.

* cited by examiner

METHOD AND DEVICE FOR DIAGNOSING SECONDARY BATTERY DEGRADATION

RELATED APPLICATIONS

This application is the U.S. National Phase under 35 U.S.C. §371 of International Application No. PCT/JP2010/007192, filed on Dec. 10, 2010, which in turn claims the benefit of Japanese Application No. 2010-074152, filed on Mar. 29, 2010, the disclosures of which Applications are incorporated by reference herein.

TECHNICAL FIELD

The present invention relates to the technology for thoroughly diagnosing secondary battery degradation.

BACKGROUND ART

There is some demand for high-capacity and high-energy density secondary batteries as power supplies for mobile devices and electric vehicles. Secondary batteries degrade by, for example, being repeatedly charged and discharged. As secondary batteries degrade, the capacity of discharge from a fully charged state (hereinafter, simply referred to as the "capacity") decreases. As a result, in the case of electric vehicles, the distance that can be traveled per charge becomes shorter. Accordingly, to make it possible to treat degradation of a secondary battery, for example, by replacing the secondary battery, at an appropriate time, there is some need to develop a method for sensing secondary battery degradation in a simplified and correct manner.

In view of this, there has been proposed a conventional determination of secondary battery degradation on the basis of an open-circuit voltage of a secondary battery and a charge capacity obtained by current integration (see Patent Document 1). Here, a capacity change is calculated from a pre-charge open-circuit voltage and a post-charge open-circuit voltage of the secondary battery, and the calculated capacity change is compared with a charge capacity obtained by current integration.

CITATION LIST

Patent Document

Patent Document 1: Japanese Laid-Open Patent Publication No. 2004-152741

DISCLOSURE OF THE INVENTION

Problem to be Solved by the Invention

However, as secondary batteries degrade, not only their capacities are reduced but also their internal resistances change. Accordingly, by simply monitoring the reduction of the capacity, it is difficult to correctly determine degradation associated with actual performance decline of a secondary battery.

In addition, particularly when an electric vehicle is the device which uses the secondary battery, it is a requisite to correctly predict the distance that can be traveled, resulting in the need to correctly determine secondary battery degradation. In such a case, the aforementioned conventional degradation determination method cannot determine secondary battery degradation with sufficient accuracy.

Therefore, an objective of the present invention is to determine secondary battery degradation in a simplified and more correct manner. Another objective of the present invention is to estimate the maximum quantity of energy that can be stored in a secondary battery, on the basis of the determination result for secondary battery degradation.

Means for Solving the Problem

One aspect of the present invention is directed to a secondary battery life diagnosis method, comprising the steps of:
acquiring a rate of voltage change of a secondary battery during charging of the secondary battery which involves a voltage change;
acquiring a rate of change in a quantity of charged electricity of the secondary battery; and
determining degradation of the secondary battery on the basis of the rate of change in the quantity of charged electricity and the rate of voltage change.

Another aspect of the present invention is directed to a secondary battery degradation diagnosis device, comprising:
voltage detection means for detecting a voltage V of a secondary battery being charged;
voltage change rate calculation means for calculating a rate of voltage change dV/dt of the secondary battery when the voltage of the secondary battery detected by the voltage detection means reaches a predetermined voltage $V_{pre}$ during the charging of the secondary battery;
charged electricity quantity change rate output means for outputting a rate of change dQ/dt in a quantity of charged electricity Q of the secondary battery when the voltage of the secondary battery detected by the voltage detection means reaches the predetermined voltage $V_{pre}$;
comparison means for calculating a ratio X: dQ/dV, of the rate of change dQ/dt in the quantity of electricity to the rate of voltage change dV/dt to compare the calculated ratio X with a reference value $X_{ref}$; and
degradation determination means for determining degradation of the secondary battery on the basis of the result of the comparison by the comparison means.

Effect of the Invention

The present invention makes it possible to determine secondary battery degradation in a simplified and more correct manner. Moreover, the present invention also makes it possible to estimate the maximum quantity of energy that can be stored in a secondary battery, on the basis of the determination result for secondary battery degradation.

While the novel features of the invention are set forth particularly in the appended claims, the invention, both as to organization and content, will be better understood and appreciated, along with other objects and features thereof, from the following detailed description taken in conjunction with the drawings.

BEST MODE FOR CARRYING OUT THE INVENTION

Figure 1:
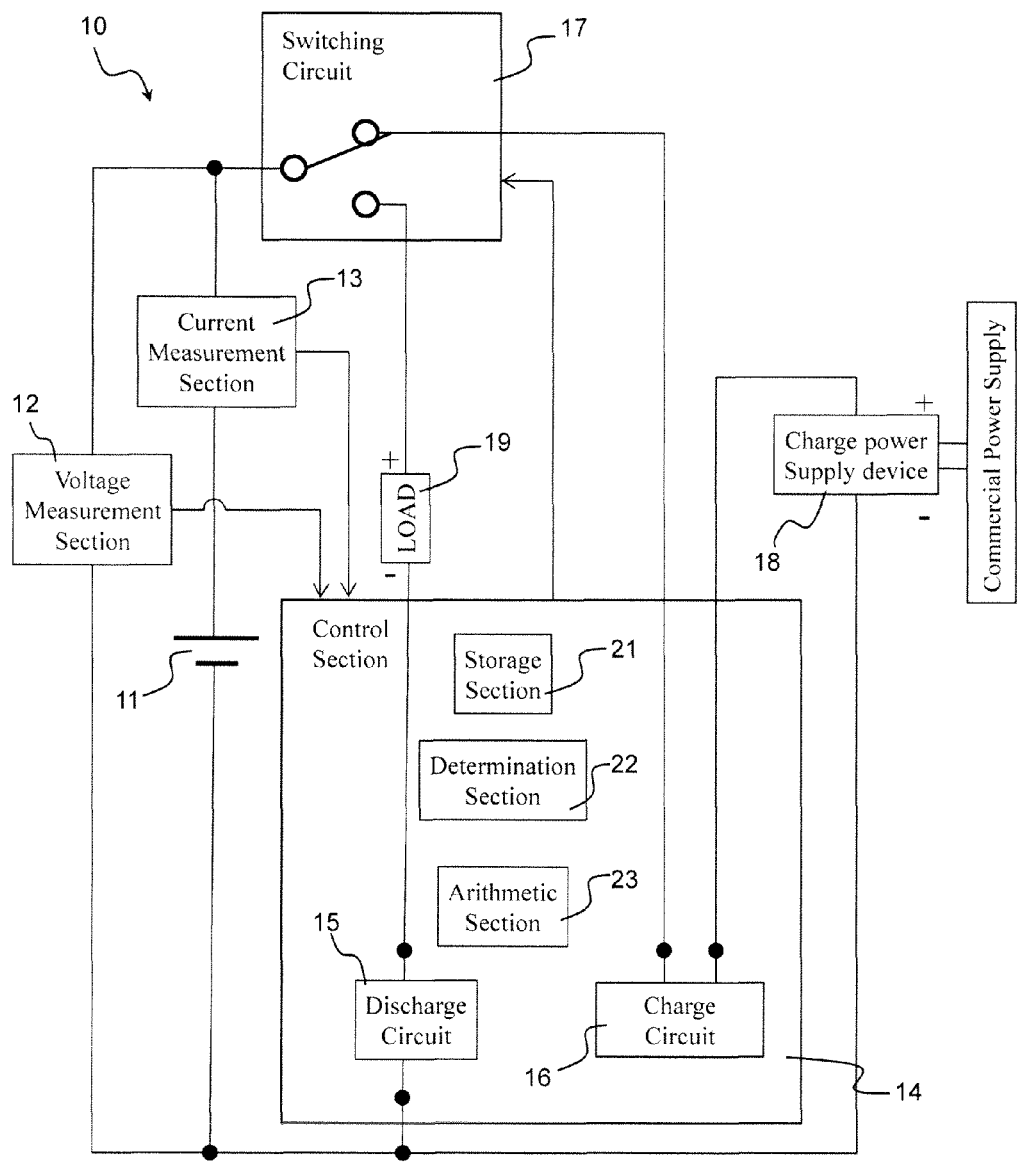
FIG. 1 is a block diagram illustrating a schematic configuration of a charge/discharge system to which a secondary battery life diagnosis method according to an embodiment of the present invention is applied.

The present invention is directed to a secondary battery life diagnosis method, including the steps of: obtaining a rate of voltage change of a secondary battery at a given point during charging of the secondary battery which involves a voltage change; calculating a rate of change in a quantity of charged electricity of the secondary battery; and determining degradation of the secondary battery on the basis of the rate of change in the quantity of charged electricity and the rate of voltage change.

More specifically, the present invention provides a secondary battery degradation diagnosis method, including the steps of:

(a) obtaining a rate of voltage change dV/dt when a voltage V of a secondary battery reaches a predetermined voltage $V_{pre}$ during charging of the secondary battery that involves a voltage change;

(b) acquiring a rate of change dQ/dt in a quantity of charged electricity Q when the voltage V of the secondary battery reaches the predetermined voltage $V_{pre}$;

(c) calculating a ratio X: dQ/dV, of the rate of change dQ/dt in the quantity of charged electricity to the rate of voltage change dV/dt to compare the calculated ratio X with a reference value $X_{ref}$; and (d) determining degradation of the secondary battery on the basis of the result of the comparison in step (c).

In the present method, degradation of a secondary battery is determined on the basis of a rate of change dV/dt in a voltage (closed-circuit voltage) of the battery at the level of a predetermined voltage $V_{pre}$ during charging of the secondary battery that involves a voltage change and a rate of change dQ/dt in the quantity of charged electricity. Here, one or more predetermined voltages $V_{pre}$ can be set so as to be lower than a charge cutoff voltage and higher than a discharge cutoff voltage.

In this manner, the predetermined voltage $V_{pre}$ can be set arbitrarily, and therefore, degradation of a secondary battery can be determined without carrying out the procedure of fully charging the secondary battery after discharging the secondary battery to a predetermined state of charge (SOC; e.g., to 0% SOC). Accordingly, it is possible to determine secondary battery degradation more frequently in a more simplified manner. Thus, necessary treatment, such as replacing a degraded secondary battery, can be performed at a more appropriate time. Note that SOC is a parameter related to a nominal capacity defined with a discharge cutoff voltage and a charge cutoff voltage. SOC is 0% where the voltage of the secondary battery is equal to the discharge cutoff voltage and 100% where the voltage of the secondary battery is equal to the charge cutoff voltage. The capacity of discharge for 50% SOC is half the capacity of discharge for 100% SOC.

Furthermore, by calculating the rate of change in the closed-circuit voltage of the secondary battery as the rate of change dV/dt in the battery voltage, and making a degradation determination based on the ratio X of the calculated rate of change to the rate of change dQ/dt in the quantity of charged electricity, it is rendered possible to determine degradation of the secondary battery on the basis of not only the change in capacity but also the change in internal resistance. Thus, it is possible to correctly estimate the degree of actual performance decline of the secondary battery, i.e., the degree of decline in the maximum quantity of energy that can be stored in the secondary battery (the maximum storable quantity of energy), thereby determining degradation of the secondary battery.

Even when the capacity of a secondary battery remains the same, if the internal resistance of the battery increases, the quantity of charged electricity up to a charge cutoff voltage decreases, and the quantity of dischargeable energy decreases. On the other hand, the amount of change in the battery voltage (closed-circuit voltage) per certain amount of change in the quantity of charged electricity of the secondary battery increases correspondingly with the internal resistance of the battery.

Accordingly, by using the ratio X: dQ/dV, it is rendered possible to determine secondary battery degradation even on the basis of the change in internal resistance. Thus, in the case of, for example, a secondary battery used as a power supply for an electric vehicle, it is possible to prevent erroneous determination such as degradation not being sensed until the actual distance that can be traveled with the secondary battery fully charged becomes extremely short.

Furthermore, for example, the rate of voltage change dV/dt at the predetermined voltage $V_{pre}$ during constant current charging can be obtained by basic four arithmetic operations based on the predetermined voltage $V_{pre}$ and a voltage taken immediately after the predetermined voltage $V_{pre}$ is reached. In addition, the rate of change dQ/dt in the quantity of charged electricity corresponds to charge current I, and can be readily calculated from the charge current I. Accordingly, quick degradation determination can be rendered possible without an arithmetic section requiring a CPU (Central Processing Unit) or suchlike which has a high processing speed.

Here, the reference value $X_{ref}$ can be a ratio, $dQ/dV_{int}$, of the rate of change dQ/dt in the quantity of charged electricity at a predetermined voltage to an initial rate of voltage change of an undegraded secondary battery at the predetermined voltage (an initial value $dV_{int}$ for the rate of voltage change). In this case, the secondary battery can be determined to be degraded, for example, when the ratio X is less than or equal to $\alpha \cdot (dQ/dV_{int})$, which is a value obtained by multiplying the reference value $X_{ref}$ by a proportion α determined in accordance with the predetermined voltage $V_{pre}$. Here, the proportion α can be, for example, from 0.5 to 0.9. That is, the secondary battery can be determined to be degraded where the ratio X is reduced to a proportion of 0.5 to 0.9 relative to the initial value.

The reason for setting the proportion α to 0.9 or less is that α being set to a value higher than 0.9 might cause an erroneous determination unless a voltage sensor and a current sensor to be used have high detection accuracy. In addition, such a setting might cause an increase in cost.

On the other hand, α being set to a value less than 0.5 results in the maximum storable quantity of energy being less than a half of its initial value. Consequently, in the case of, for example, an electric vehicle, the distance that can be traveled is reduced to less than a half of its initial value. In addition, the internal resistance of the battery increases, and the amount of heat to be generated during charging/discharging increases, conceivably leading to compromised safety. Proportion α preferably ranges from 0.6 to 0.8.

In one mode of the present invention, the following step is further performed, which is calculating a present value $QM_{pv}$ of the maximum storable quantity of energy of the secondary battery on the basis of:

a quotient Y: $dV_{int}/dV$, of the calculated ratio X: $dQ/dV$, with respect to the reference value $X_{ref}$: $dQ/dV_{int}$, and the initial value $QM_{int}$ of the maximum storable quantity of energy QM of the secondary battery.

With this configuration, it is possible not only to determine whether the secondary battery has been degraded according to certain standards but also to represent the very degree of degradation of the secondary battery by a parameter related to the maximum storable quantity of energy QM. Thus, in the case where the secondary battery is used as, for example, a power supply for an electric vehicle, it is even possible to estimate the actual distance that can be traveled with the secondary battery fully charged, upon each charging of the secondary battery.

Figure 2:
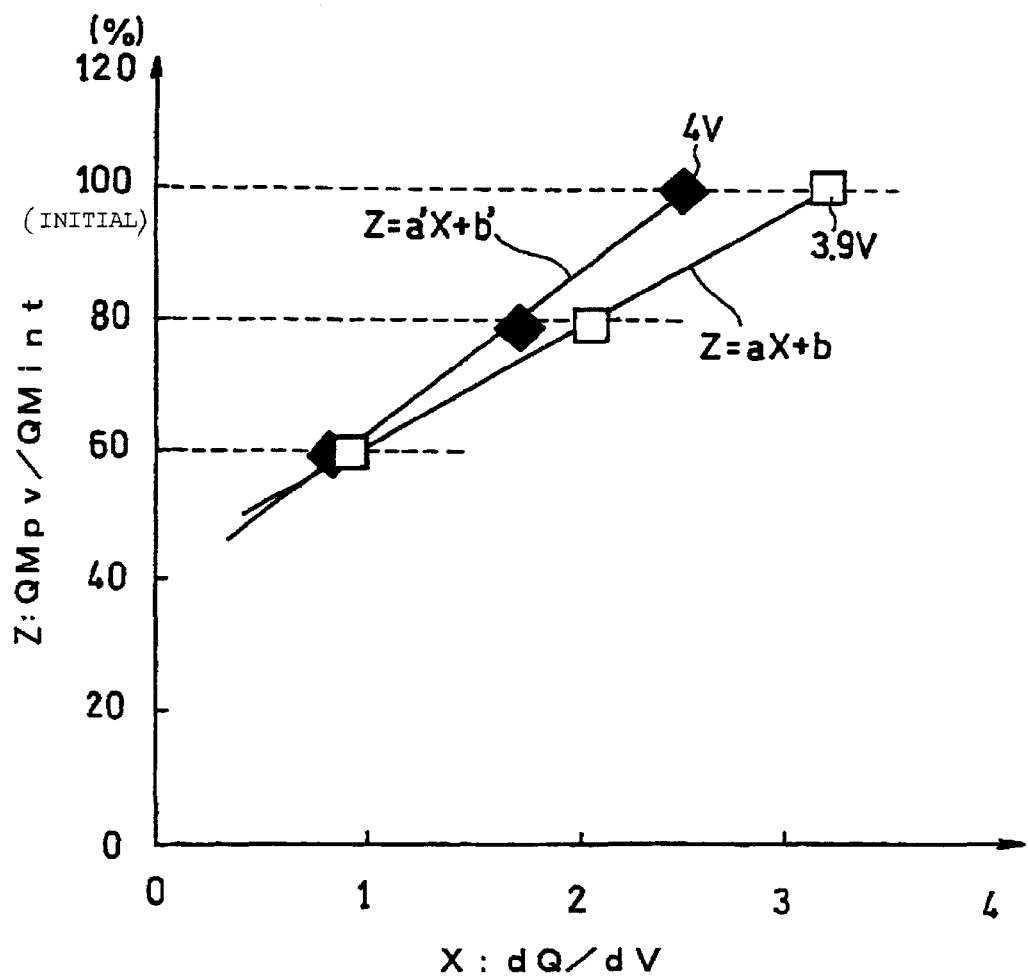
FIG. 2 is a graph representing the relationship between a parameter related to the degree of degradation and a ratio X, thereby illustrating the basic principle of a secondary battery degradation determination.

The present inventor has confirmed by experiments that, for a wide range of predetermined voltage $V_{pre}$ corresponding to 0 to 100% SOC, the relationship between the ratio X and the parameter related to the maximum storable quantity of energy (here, Z: $QM_{pv}/QM_{int}$) can be successfully approximated by a linear function (see FIG. 2). In FIG. 2, outlined rectangles (□) plot (X,Z) where the predetermined voltage $V_{pre}$ is 3.9V. Solid rectangles (■) plot (X,Z) where the predetermined voltage $V_{pre}$ is 4V.

As shown in FIG. 2, where Z: $QM_{pv}/QM_{int}$, is approximated by a linear function of X, a coefficient of determination (contribution) R2 is 0.99 or more, hence approximately equal to 1. Accordingly, it is possible to use a wide range of predetermined voltage $V_{pre}$ from a discharge cutoff voltage to a charge cutoff voltage to sense the degree of degradation of the secondary battery with high accuracy and the maximum storable quantity of energy at the time with high accuracy.

In another mode of the present invention, the ratio X: $dQ/dV$, is obtained for each of a plurality of predetermined voltages $V_{pre}$ different from each other.

With this configuration, it is possible to enhance the accuracy of degradation determination by, for example, obtaining an average of a plurality of obtained ratios X: $dQ/dV$, and comparing the average to the reference value $X_{ref}$.

In still another mode of the present invention, when the quotient Y: $dV_{int}/dV$, is in the range from 0.4 to 1, the present value $QM_{pv}$ of the maximum storable quantity of energy QM is calculated by the following equation:

$$QM_{pv}=AY+B.$$

Here, each of A and B is a constant.

Figure 5:
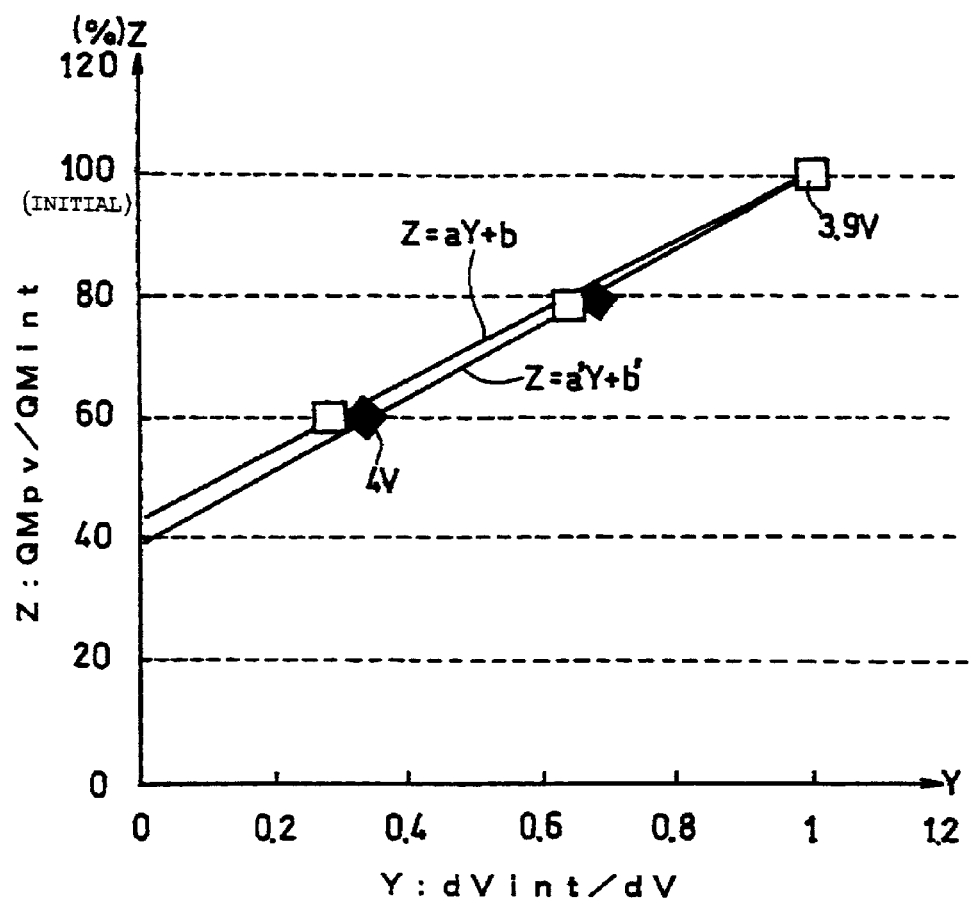
FIG. 5 is a graph representing the relationship between a parameter related to the degree of degradation and a quotient Y, thereby illustrating the basic principle of a secondary battery degradation estimation.

As described earlier, the present value $QM_{pv}$ of the maximum storable quantity of energy can be correctly estimated using the initial value $QM_{int}$ and the quotient Y: $dV_{int}/dV$. In addition, the present inventors have confirmed by experiments that a graph representing the relationship between Z: $QM_{pv}/QM_{int}$ and the quotient Y: $dV_{int}/dV$, includes straight lines approximately overlapping each other where the quotient Y: $dV_{int}/dV$, is within the range from 0.4 to 1 even if the value of the predetermined voltage $V_{pre}$ is changed variously (see FIG. 5). In FIG. 5, outlined rectangles (□) plot (Y,Z) where the predetermined voltage $V_{pre}$ is 3.9V. Solid rectangles (■) plot (Y,Z) where the predetermined voltage $V_{pre}$ is 4V.

Accordingly, so long as the quotient Y: $dV_{int}/dV$, is within the range from 0.4 to 1, it is also possible to calculate the present value $QM_{pv}$ of the maximum storable quantity of energy using the above equation.

Here, the present invention is typically applied to the secondary battery being charged by constant current charging. The reason for this is that, by applying the invention to the secondary battery being charged by constant current charging, the best accuracy of degradation determination can be achieved. However, the present invention can also be applied at times other than when the secondary battery is being charged by constant current charging, so long as a charge method is employed in which the battery voltage changes by charging.

For example, so long as the battery voltage changes by charging, the present invention can also be applied to the case where control is performed such that charge is carried out with higher charge current when the state of charge is low, and charge is carried out with lower charge current when the state of charge is higher than a certain level, or vice versa. However, such a control method can be considered as one type of constant current charging because charge is carried out with constant current at each time point.

Furthermore, in the case of constant current charging, dQ/dt takes a constant value (quantity of electricity (Q)=current (I)×time (t)). Thus, even in the case where dt/dV, rather than dQ/dV, is used as the ratio X, it is also possible to perform degradation determination and estimate the degree of degradation.

Hereinafter, an embodiment of the present invention will be described with reference to the drawings.

Embodiment 1

FIG. 1 is a block diagram illustrating a schematic configuration of a charge/discharge system to which a secondary battery life diagnosis method according to an embodiment of the present invention is applied. The secondary battery used in the charge/discharge system shown as an example is a lithium-ion secondary battery. The internal resistance of the lithium-ion secondary battery increases at a high rate relative to the amount of reduction in the capacity due to degradation, and therefore the lithium-ion secondary battery highly requires application of the present invention in which determinations are made additionally considering the change in internal resistance due to degradation.

The charge/discharge system 10 includes a secondary battery (hereinafter, simply referred to as a "battery") 11, a voltage measurement section 12 for detecting a terminal voltage of the battery 11, a current measurement section 13 for measuring discharge and charge currents of the battery 11, a control section 14 for controlling charging/discharging of the battery 11, and a switching circuit 17. The control section 14 includes a discharge circuit 15, a charge circuit 16, a storage section 21, a determination section 22, and an arithmetic section 23.

The charge/discharge system 10 further includes a charge power supply device 18, and a loading device 19 for consuming power supplied by the battery 11. The charge power supply device 18 includes a converter (rectifier circuit), and is connected to an external power supply such as a commercial alternating current power supply. The loading device 19 can be, for example, a cell phone, a personal computer, a portable game device, or a transportation device (e.g., an electric vehicle).

Note that, depending on the specific type of the loading device 19, the charge/discharge system 10 can be configured such that the charge power supply device 18 supplies power to the loading device 19, and the battery 11 is charged with regenerative energy from the loading device 19 or power from another power supply. Here, for the sake of simplified description, the charge/discharge system 10 is configured such that the loading device 19 is supplied with power only from the battery 11.

The battery 11 is connected parallelly to the voltage measurement section 12, and serially to the current measurement section 13. Each of the discharge circuit 15 and the charge circuit 16 has a pair of terminals. Note that as the current measurement section 13, a current sensor (a contactless sensor using a Hall element or suchlike) not serially connected to the battery 11 can be used.

The battery 11 has a positive terminal connected to one terminal of the current measurement section 13, and the current measurement section 13 is connected at the other terminal to the switching circuit 17. Note that in the case where a contactless sensor is used as the current measurement section 13, the positive terminal of the battery 11 is directly connected to the switching circuit 17.

The battery 11 has a negative terminal connected to one terminal of the discharge circuit 15 and a negative terminal of the charge power supply device 18. The discharge circuit 15 is connected at the other terminal to a negative-side terminal of the loading device 19. The charge power supply device 18 has a positive terminal connected to one terminal of the charge circuit 16. The charge circuit 16 is connected at the other terminal to the switching circuit 17. The loading device 19 has a positive-side terminal connected to the switching circuit 17.

The switching circuit 17 is provided with a discharge switch for controlling connection between the positive terminal of the battery 11 and the positive-side terminal of the loading device 19, and a charge switch for controlling connection between the positive terminal of the battery 11 and the aforementioned other terminal of the charge circuit 16.

When the discharge switch is turned ON, the charge switch is turned OFF, so that the positive terminal of the battery 11 is connected to the positive-side terminal of the loading device 19. When the discharge switch is turned OFF, the connection is disabled.

On the other hand, when the charge switch is turned ON, the discharge switch is turned OFF, so that the positive terminal of the battery 11 is connected to the aforementioned other terminal of the charge circuit 16. When the charge switch is turned OFF, the connection is disabled.

Furthermore, when both the discharge switch and the charge switch are turned OFF, the battery 11 is only connected in parallel with the voltage measurement section 12.

By the above configuration, when the discharge switch of the switching circuit 17 is turned ON, the battery 11 is connected to the loading device 19, so that the loading device 19 is supplied with power from the battery 11.

On the other hand, when the charge switch of the switching circuit 17 is turned ON, the battery 11 and the charge power supply device 18 are parallelly connected, so that the battery 11 is charged.

The control section 14 can be made up of, for example, a CPU (Central Processing Unit) included in the arithmetic section 23, a microcomputer, an MPU (Micro-Processing Unit), etc., functioning as main and auxiliary storage devices included in the storage section 21, and various logic circuits. The control section 14 receives information regarding the terminal voltage, the charge current, and the discharge current of the battery 11 measured by the voltage measurement section 12 and the current measurement section 13.

The storage section 21 of the control section 14 can be formed by nonvolatile memory. For example, the storage section 21 has stored therein information about the reference value $X_{ref}$, information about the predetermined voltage $V_{pre}$, information about the charge cutoff voltage, information about the discharge cutoff voltage, information about the cutoff current, and information indicating the relationship between the ratio X: dQ/dV, and the degree of degradation: $(1-QM_{pv}/QM_{int})$.

The determination section 22 compares the ratio X and the reference value $X_{ref}$, and performs a determination process such as degradation determination for the battery 11. The arithmetic section 23 performs an arithmetic process, such as calculation of the ratio X and the degree of degradation: $(1-QM_{pv}/QM_{int})$, on the basis of the terminal voltage and the charge current of the battery 11 measured by the voltage measurement section 12 and the current measurement section 13.

FIG. 2 illustrates an example of the relationship between the ratio X: dQ/dV, and the parameter Z: $QM_{pv}/QM_{int}$, related to the degree of degradation of a secondary battery. As in the graph shown in the figure, for both cases where the voltage of the secondary battery being charged is 3.9V and where the voltage is 4V, the ratio X: dQ/dV, and the parameter Z: $QM_{pv}/QM_{int}$, related to the degree of degradation of the secondary battery can be successfully approximated by a linear function with a coefficient of determination (contribution) R2 approximately equal to 1. Thus, by comparing the ratio X: dQ/dV, with the reference value $X_{ref}$: $dQ/dV_{int}$, the degree of degradation of the secondary battery can be estimated with high accuracy.

In a charge mode (where the charge switch is ON), the control section 14 reads and refers to information about the charge cutoff voltage from the storage section 21, and performs constant current charging until the terminal voltage of the battery 11 measured by the voltage measurement section 12 reaches the charge cutoff voltage, and thereafter constant voltage charging. In the case of constant voltage charging, the control section 14 reads information about the cutoff current from the storage section 21. Then, the information being read is referenced, and when the value of current is reduced to the level of the cutoff current, the charging of the battery 11 is stopped, and the charge/discharge system 10 is switched to a discharge mode (where the discharge switch is ON).

In the discharge mode, the control section 14 reads and refers to information about the discharge cutoff voltage from the storage section 21, and performs discharging until the terminal voltage of the battery 11 measured by the voltage measurement section 12 is reduced to the level of the discharge cutoff voltage. Once the terminal voltage of the battery 11 reaches the level of the discharge cutoff voltage, the discharging of the battery 11 is stopped, and the charge/discharge system 10 is switched to the charge mode (where the charge switch is ON).

Figure 3:
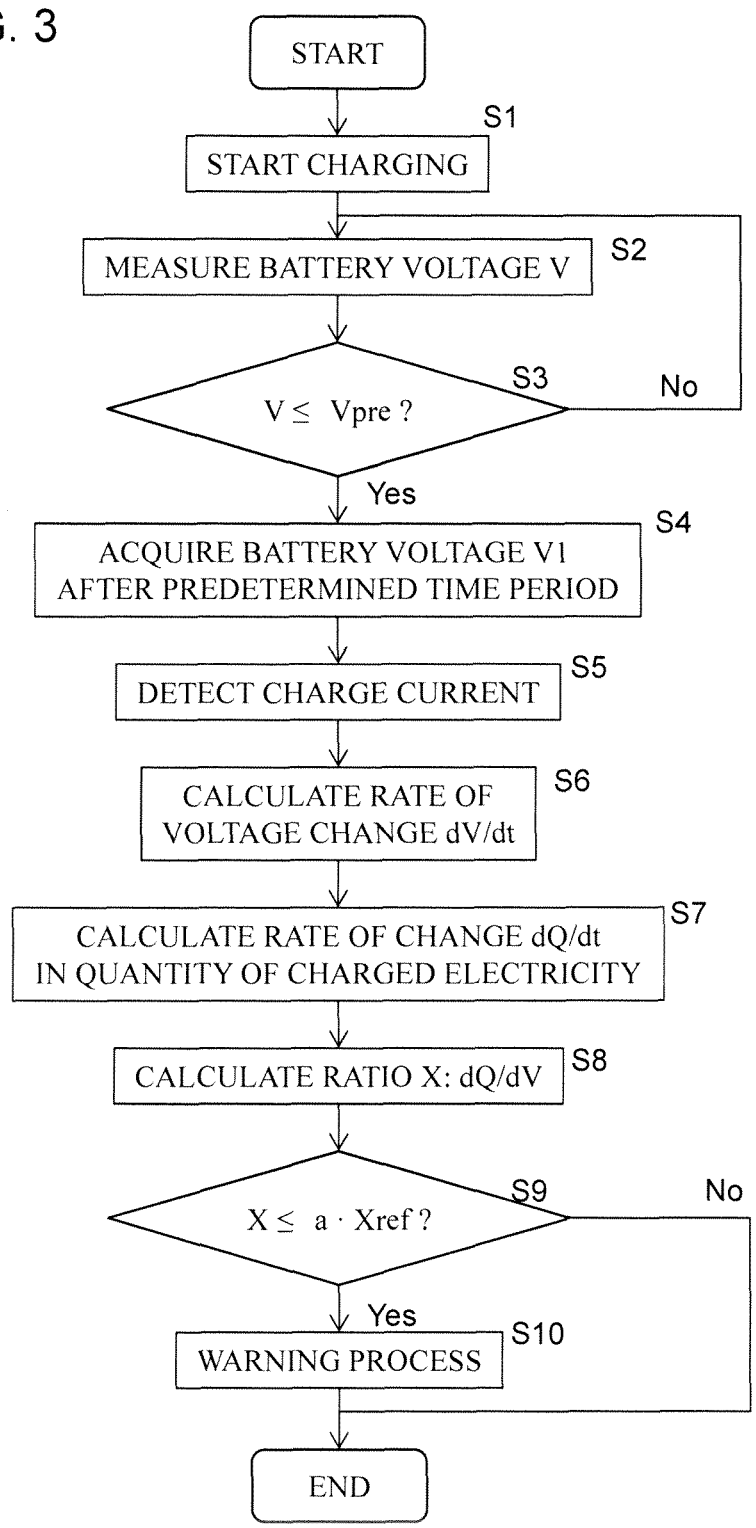
FIG. 3 is a flowchart of a process for determining degradation.

Next, referring to FIG. 3, the process for determining degradation of the battery 11 will be described. Note that this process is performed when the voltage of the battery 11 is less than or equal to the predetermined voltage $V_{pre}$, and the battery 11 is being charged with constant current. Here, one or more predetermined voltages $V_{pre}$ can be arbitrarily set so as to be lower than the charge cutoff voltage and higher than the discharge cutoff voltage. Alternatively, constant current charging may be performed while switching the value of current stepwise.

When the charging of the secondary battery starts (step S1), the voltage measurement section 12 starts measuring the terminal voltage V of the battery 11 (step S2). The determination section compares the measured voltage V and the predetermined voltage $V_{pre}$ (step S3), and when the voltage V matches the predetermined voltage $V_{pre}$ (Yes in step S3), a constant voltage V1 measured after a predetermined period of time (e.g., one minute) is held by the arithmetic section 23

(step S4). In addition, the current measurement section 13 detects charge current I at the time when the voltage V matches the predetermined voltage $V_{pre}$ (step S5). When the voltage V is less than the predetermined voltage $V_{pre}$ (No in step S3), steps S2 and S3 are repeated until the voltage V reaches the predetermined voltage $V_{pre}$.

The arithmetic section 23 calculates the rate of voltage change dV/dt at the predetermined voltage $V_{pre}$ on the basis of the predetermined voltage $V_{pre}$, the measured voltage V1, and the predetermined period of time (step S6). Then, from the detected charge current I, the arithmetic section 23 computes the rate of change dQ/dt in the quantity of charged electricity Q of the battery 11 (step S7). Note that when a plurality of predetermined voltages $V_{pre}$ are set, the rates of change dV/dt and dQ/dt can be calculated for each of the predetermined voltages $V_{pre}$.

Next, the arithmetic section 23 calculates the ratio X: dQ/dV, of the rate of change dQ/dt in the quantity of charged electricity and the rate of voltage change dV/dt (step S8). The determination section 22 compares the calculated ratio X and a value $\alpha \cdot X_{ref}$ obtained by multiplying the reference value $X_{ref}$ by a predetermined proportion $\alpha$ (step S9), and when the ratio X is less than or equal to the value $\alpha \cdot X_{ref}$ (Yes in step S9), the battery 11 is sensed as degraded, so that a process for warning the user of degradation of the battery 11 is performed (step S10). On the other hand, when the ratio X exceeds the value $\alpha \cdot X_{ref}$ (No in step S9), the process ends as the battery 11 is not detected as degraded.

Here, the predetermined proportion $\alpha$ can be, for example, from 0.5 to 0.9. A more preferred range of $\alpha$ is from 0.6 to 0.8. Note that the determination of degradation can be carried out on the basis of the rates of change dV/dt and dQ/dt calculated for each of the predetermined voltages $V_{pre}$ different from each other. In this case, an odd number of predetermined voltages $V_{pre}$ are set so that the majority's result can be employed as a final determination result.

Figure 4:
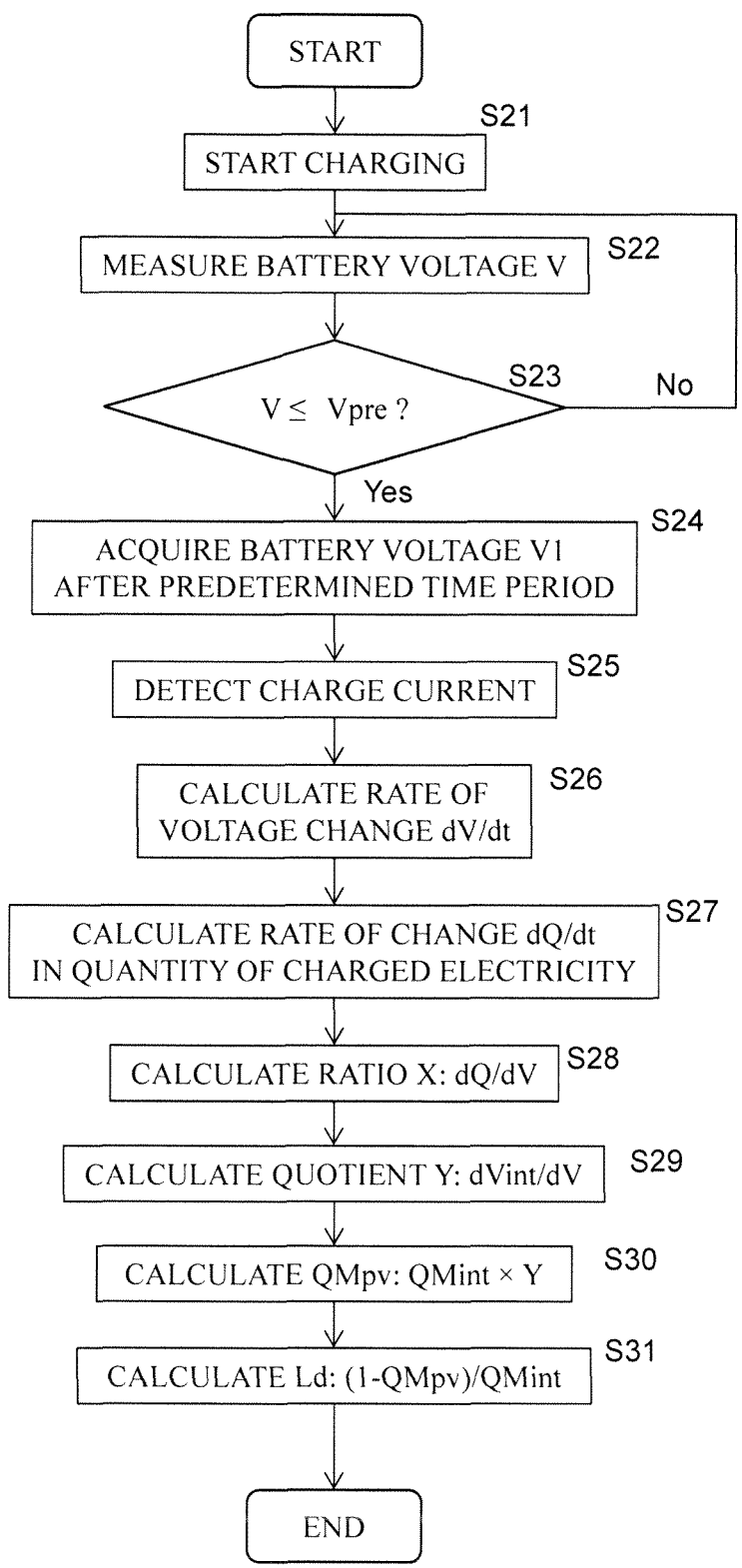
FIG. 4 is a flowchart of a process for estimating the degree of degradation.

Next, referring to FIG. 4, the process for estimating the degree of degradation of the battery 11 will be described. This process also is carried out when the voltage of the battery 11 is less than or equal to the predetermined voltage $V_{pre}$, and the battery 11 is being charged with constant current.

When the charging of the secondary battery starts (step S21), the voltage measurement section 12 starts measuring the terminal voltage V of the battery 11 (step S22). The determination section compares the measured voltage V and the predetermined voltage $V_{pre}$ (step S23), and when the voltage V matches the predetermined voltage $V_{pre}$ (Yes in step S23), a voltage V1 measured after a predetermined period of time (e.g., one minute) is held by the arithmetic section 23 (step S24). In addition, the current measurement section 13 detects charge current I at the time when the voltage V matches the predetermined voltage $V_{pre}$ (step S25). When the voltage V is less than the predetermined voltage $V_{pre}$ (No in step S23), steps S22 and S23 are repeated until the voltage V reaches the predetermined voltage $V_{pre}$.

The arithmetic section 23 calculates the rate of voltage change dV/dt at the predetermined voltage $V_{pre}$ on the basis of the predetermined voltage $V_{pre}$, the measured voltage V1, and the predetermined period of time (step S26). Then, from the detected charge current I, the arithmetic section 23 computes the rate of change dQ/dt in the quantity of charged electricity Q of the battery 11 (step S27). Note that when a plurality of predetermined voltages $V_{pre}$ are set, the rates of change dV/dt and dQ/dt can be calculated for each of the predetermined voltages $V_{pre}$.

Next, the arithmetic section 23 calculates the ratio X: dQ/dV, of the rate of change dQ/dt in the quantity of charged electricity to the rate of voltage change dV/dt (step S28). In addition, the arithmetic section 23 reads $dQ/dV_{int}$ from the storage section and calculates the quotient Y: $dV_{int}/dV$, of dQ/dV with respect to $dQ/dV_{int}$ (step S29).

Thereafter, the arithmetic section 23 reads information about $QM_{int}$ from the storage section, and calculates the present value QMpv of the maximum storable quantity of energy of the battery 11 by equation (1) below (step S30), and the degree of degradation $L_d$ of the battery 11 by equation (2) below (step S31). Note that the degree of degradation $L_d$ can be calculated on the basis of the rates of change dV and dQ calculated for each of the predetermined voltages $V_{pre}$ different from each other. At this time, an average of the degrees of degradation $L_d$ calculated for the predetermined voltages $V_{pre}$ can be employed as an estimate value for the final degree of degradation $L_d$.

$$QM_{pv} = QM_{int} \times Y \tag{1}$$

$$L_d = 1 - QM_{pv}/QM_{int} \tag{2}$$

Here, the calculation of $QM_{pv}$ in step S30 can also be performed by equation (3) below.

$$QM_{pv} = AY + B \tag{3}$$

Here, A and B are constants.

As shown in FIG. 5, the present inventors have confirmed by experiments that a graph representing the relationship between $QM_{pv}/QM_{int}$ and the quotient Y: $dV_{int}/dV$, includes straight lines approximately overlapping each other where the quotient Y: $dV_{int}/dV$, is within the range from 0.4 to 1 even if the value of the predetermined voltage $V_{pre}$ is changed variously. Accordingly, so long as the quotient Y: $dV_{int}/dV$, is within the range from 0.4 to 1, it is also possible to calculate the present value QMpv of the maximum storable quantity of energy using the above equation (3).

Note that constants A and B can be determined by experiments.

While the present invention has been described above with respect to an embodiment, the present invention is not limited to this. As an example of the secondary battery, the lithium-ion secondary battery is mentioned, but the present invention can achieve correct life diagnosis as well even when secondary batteries other than the lithium-ion secondary battery are applied. Thus, the present invention can be applied to secondary batteries other than the lithium-ion secondary battery.

INDUSTRIAL APPLICABILITY

The present invention makes it possible to diagnose the life of secondary batteries widely used as power supplies for mobile devices and transportation devices, in a correct and simplified manner additionally considering changes in internal resistance. Thus, the present invention can very effectively be applied to secondary batteries to be used as power supplies for notebook computers, cell phones, electric vehicles, etc.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

DESCRIPTION OF THE REFERENCE CHARACTERS 10 charge/discharge system
11 battery
12 voltage measurement section
13 current measurement section
14 control section
19 loading device
21 storage section
22 determination section
23 arithmetic section

The invention claimed is:

1. A secondary battery life diagnosis method, comprising steps of:
   (a) calculating, by a control circuit, a rate of voltage change dV/dt when a voltage V of a secondary battery reaches a predetermined voltage $V_{pre}$ during charging of the secondary battery that involves a voltage change;
   (b) calculating, by the control circuit, a rate of change dQ/dt in a quantity of charged electricity Q when the voltage V of the secondary battery reaches the predetermined voltage $V_{pre}$;
   (c) calculating, by the control circuit, a ratio X: dQ/dV, of the rate of change dQ/dt in the quantity of charged electricity to the rate of voltage change dV/dt to compare the calculated ratio X with a reference value $X_{ref}$; and
   (d) determining, by the control circuit, degradation of the secondary battery on the basis of the result of the comparison in step (c).

2. The secondary battery life diagnosis method according to claim 1, wherein:
   the reference value $X_{ref}$ is a ratio $dQ/dV_{int}$ of the rate of change dQ/dt in the quantity of charged electricity to an initial value $dV_{int}/dt$ for the rate of voltage change dV/dt of the secondary battery at the predetermined voltage $V_{pre}$, and
   the secondary battery is determined to be degraded when the ratio X is less than or equal to $\alpha \cdot (dQ/dV_{int})$, which is a value obtained by multiplying the reference value $X_{ref}$ by a proportion $\alpha$ determined in accordance with the predetermined voltage $V_{pre}$.

3. The secondary battery life diagnosis method according to claim 2, further comprising a step of (e) calculating, by the control circuit, a present value QMpv of a maximum storable quantity of energy QM of the secondary battery on the basis of:
   a quotient Y: $dV_{int}/dV$, of the calculated ratio X: dQ/dV, with respect to the reference value $X_{ref}$, $dQ/dV_{int}$, and an initial value $QM_{int}$ of the maximum storable quantity of energy of the secondary battery.

4. The secondary battery life diagnosis method according to claim 1, wherein the ratio X: dQ/dV, is obtained for each of a plurality of the predetermined voltages $V_{pre}$ different from each other.

5. The secondary battery life diagnosis method according to claim 2, wherein, when the quotient Y: $dV_{int}/dV$, is within the range from 0.4 to 1, the present value QMpv of the maximum storable quantity of energy QM is calculated by equation $QM_{pv}=AY+B$ where each of A and B is a constant.

6. The secondary battery life diagnosis method according to claim 1, wherein the secondary battery is charged by constant current charging.

7. The secondary battery life diagnosis method according to claim 1, wherein the control circuit includes a processor, a storage device and a logic circuit.

8. The secondary battery life diagnosis method according to claim 1, wherein
   in the step (a), the rate of voltage change dV/dt is calculated by the control circuit based on a voltage of the secondary battery detected by a voltage detector, and
   in the step (b), the rate of change dQ/dt is calculated by the control circuit based on a charging or discharging current of the secondary battery detected by a current detector.

9. A secondary battery degradation diagnosis device, comprising:
   a voltage detector configured to detect a voltage V of a secondary battery being charged; and
   a controller configured to:
      calculate a rate of voltage change dV/dt of the secondary battery when the voltage of the secondary battery detected by the voltage detector reaches a predetermined voltage $V_{pre}$ during the charging of the secondary battery;
      calculate a rate of change dQ/dt in a quantity of charged electricity Q of the secondary battery when the voltage of the secondary battery detected by the voltage detector reaches the predetermined voltage $V_{pre}$;
      calculate a ratio X: dQ/dV, of the rate of change dQ/dt in the quantity of electricity to the rate of voltage change dV/dt to compare the calculated ratio X with a reference value $X_{ref}$; and
      determine degradation of the secondary battery based on a result of the comparison.

10. The secondary battery degradation diagnosis device according to claim 9, wherein the controller further configured to calculate a present value QMpv of a maximum storable quantity of energy QM of the secondary battery based on the result of the comparison and an initial value $QM_{int}$ of the maximum storable quantity of energy of the secondary battery.

* * * * *